US010923855B2

(12) United States Patent
Matsuo

(10) Patent No.: US 10,923,855 B2
(45) Date of Patent: Feb. 16, 2021

(54) CONNECTOR TO PREVENT MISCONNECTION OF CONTACTS WITHOUT THE USE OF A PROJECTION AND A GROOVE

(71) Applicant: JAPAN AVIATION ELECTRONICS INDUSTRY, LIMITED, Tokyo (JP)

(72) Inventor: Seiya Matsuo, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/456,742

(22) Filed: Jun. 28, 2019

(65) Prior Publication Data

US 2020/0052441 A1    Feb. 13, 2020

(30) Foreign Application Priority Data

Aug. 7, 2018    (JP) .............................. JP2018-148527

(51) Int. Cl.
  *H01R 13/642*  (2006.01)
  *A41D 1/00*  (2018.01)
  *H01R 12/77*  (2011.01)
  *H01R 33/76*  (2006.01)
  *H05K 1/03*  (2006.01)

(52) U.S. Cl.
  CPC ........... *H01R 13/642* (2013.01); *A41D 1/005* (2013.01); *H01R 12/771* (2013.01); *H01R 33/765* (2013.01); *H05K 1/038* (2013.01)

(58) Field of Classification Search
  CPC .. H01R 13/642; H01R 12/771; H01R 33/765; H01R 4/64; H01R 4/58; H01R 12/77; A41D 1/005; H05K 1/038

USPC .................................. 439/678, 37, 677, 909
  See application file for complete search history.

(56) References Cited

U.S. PATENT DOCUMENTS 4,869,255 A * 9/1989 Putz ..................... A61B 5/0476
                                                                    600/378
5,080,603 A * 1/1992 Mouissie ........... H01R 13/6273
                                                                    439/353

(Continued)

FOREIGN PATENT DOCUMENTS

EP          2637263 A1    9/2013
JP          11017049 A    1/1999

(Continued)

*Primary Examiner* — Travis S Chambers
(74) *Attorney, Agent, or Firm* — Muncy, Geissler, Olds & Lowe, PC

(57) ABSTRACT

A connector includes two by N contacts arranged in two columns and N rows, where N is an integer of three or more, N contacts in each column being arrayed at a predetermined pitch in a first direction parallel to each column within a corresponding one of column areas each extending in the first direction and having a predetermined width in a second direction perpendicular to the first direction, a distance between two contacts in one endmost row in the first direction among the N rows being larger than a distance between two contacts in each of the other rows and different in length from the predetermined pitch, a distance between two contacts in the other endmost row in the first direction among the N rows being smaller than a distance between two contacts in each of the other rows and different in length from the predetermined pitch.

8 Claims, 12 Drawing Sheets

(56) References Cited

U.S. PATENT DOCUMENTS

| | | | | |
|---|---|---|---|---|
| 5,562,607 A * | 10/1996 | Gyory | .................. | A61N 1/0436 |
| | | | | 604/20 |
| 6,561,814 B2 * | 5/2003 | Tilbury | .................. | A41D 1/005 |
| | | | | 2/102 |
| 7,118,380 B1 * | 10/2006 | Kraz | .................. | H01R 13/6485 |
| | | | | 439/37 |
| 8,465,328 B2 * | 6/2013 | Iida | ........................ | H01R 12/62 |
| | | | | 439/660 |
| 10,084,276 B2 * | 9/2018 | Matsuo | .............. | H01R 43/0221 |
| 10,199,770 B2 * | 2/2019 | Komoto | .................. | H01R 12/58 |
| 10,283,907 B2 * | 5/2019 | Matsuo | .................. | H01R 12/91 |
| 10,320,117 B2 * | 6/2019 | Lewallen | ................ | A41D 1/005 |
| 2005/0090153 A1 * | 4/2005 | Brochu | .................. | H01R 27/02 |
| | | | | 439/677 |
| 2009/0208168 A1 * | 8/2009 | Ishikawa | ................ | H01R 12/79 |
| | | | | 385/14 |
| 2011/0151727 A1 * | 6/2011 | Du | ........................ | H01R 12/716 |
| | | | | 439/677 |
| 2014/0213074 A1 * | 7/2014 | Tsang | ................ | H01R 13/5213 |
| | | | | 439/37 |
| 2015/0296935 A1 * | 10/2015 | Rana | .................... | A44C 5/0007 |
| | | | | 63/3 |

FOREIGN PATENT DOCUMENTS

| | | |
|---|---|---|
| JP | 2013187006 A | 9/2013 |
| KR | 20170096748 A | 8/2017 |
| KR | 20180052431 A | 5/2018 |

* cited by examiner

CONNECTOR TO PREVENT MISCONNECTION OF CONTACTS WITHOUT THE USE OF A PROJECTION AND A GROOVE

BACKGROUND OF THE INVENTION

The present invention relates to a connector, particularly to a connector having a structure that prevents an incorrect fitting with a counter connector.

As a connector having a structure that prevents an incorrect fitting, for instance, JP 2013-187006 A discloses an electric connector for connecting a receptacle 1 shown in FIG. 26 and a plug 2 shown in FIG. 27.

The receptacle 1 includes an insulating housing 3 and a plurality of contacts 4 held in the insulating housing 3, and the insulating housing 3 is provided with a fitting hole 3A and a key groove 3B that is in a position offset from a central axis A1 of the fitting hole 3A. The plug 2 includes an insulating housing 5 and a plurality of contacts 6 held in the insulating housing 5, and the insulating housing 5 is provided with a fitting projection 5A and a key projection 5B that is in a position offset from a central axis A2 of the fitting projection 5A and corresponding to the key groove 3B of the receptacle 1.

When the receptacle 1 and the plug 2 are fitted with each other, the fitting projection 5A of the plug 2 is inserted into the fitting hole 3A of the receptacle 1, and the contacts 6 of the plug 2 and the contacts 4 of the receptacle 1 are connected to each other.

At this time, the key projection 5B of the plug 2 is fitted in the key groove 3B of the receptacle 1, and this configuration prevents an incorrect fitting.

Meanwhile, because the key groove 33 is formed in the insulating housing 3 of the receptacle 1 and the key projection 5B is formed on the insulating housing 5 of the plug 2, the receptacle 1 and the plug 2 are increased in size, disadvantageously. When places for having the key groove 3B and the key projection 5B cannot be secured in the receptacle 1 and the plug 2 for the reason of size reduction of the connector, a prevention of an incorrect fitting by means of the key groove 3B and the key projection 5B cannot be implemented.

Besides, the plurality of contacts 4 of the receptacle 1 consist of six contacts arranged in two columns along a first direction D1 and three rows along the direction perpendicular to the first direction D1, and the same applies to the plurality of contacts 6 of the plug 2; pairs of contacts in the respective rows have the same column-to-column pitch P. Therefore, when the plug 2 is tried to be fitted to the receptacle 1 in a position where it is inclined in the first direction D1 relative to the receptacle 1, of the three rows of contacts 6 of the plug 2, one row of contacts 6 situated at an end in the first direction D1 may be wrongly connected to, of the three rows of contacts 4 of the receptacle 1, the middle row of contacts 4 for example.

If, due to the fitting with inclination, some of the contacts 4 of the receptacle 1 are wrongly connected to non-corresponding contacts 6 of the plug 2 as above, an electronic circuit connected to the receptacle 1 or the plug 2 may be supplied with an unexpected electric signal and thereby damaged, or the contacts 4 of the receptacle 1 and the contacts 6 of the plug 2 may be applied with an unexpected external force and thereby damaged.

SUMMARY OF THE INVENTION

The present invention has been made to overcome the conventional problems as above and aims at providing a connector that can prevent an incorrect fitting as well as misconnection of contacts without the use of a projection and a groove for a prevention of an incorrect fitting.

A connector according to the present invention comprises:
two by N contacts arranged in two columns and N rows, where N is an integer of three or more,
wherein N contacts in each column are arrayed at a predetermined contact-to-contact pitch in a first direction parallel to each column within a corresponding one of column areas each extending in the first direction and having a predetermined width in a second direction perpendicular to the first direction,
wherein a distance between two contacts in one endmost row in the first direction among the N rows is larger than a distance between two contacts in each of the other rows and is different in length from the predetermined contact-to-contact pitch, and
wherein a distance between two contacts in the other endmost row in the first direction among the N rows is smaller than a distance between two contacts in each of the other rows and is different in length from the predetermined contact-to-contact pitch.

DETAILED DESCRIPTION OF THE INVENTION

Embodiments of the present invention are described below based on the appended drawings.

Embodiment 1

Figure 1:
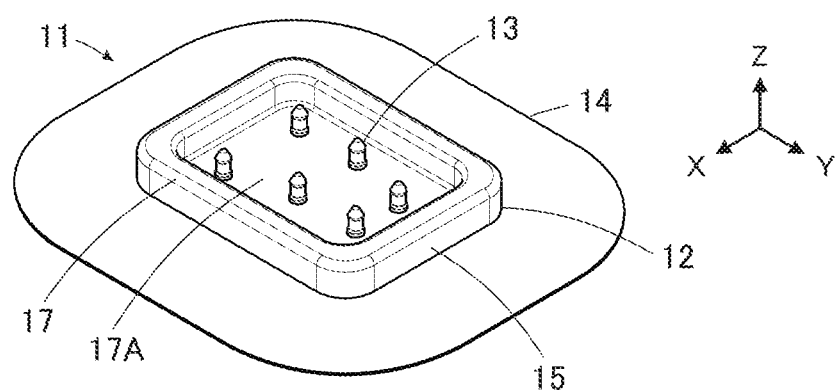
FIG. 1 is a perspective view of a connector according to Embodiment 1 of the present invention when viewed from an obliquely upper position.
Figure 2:
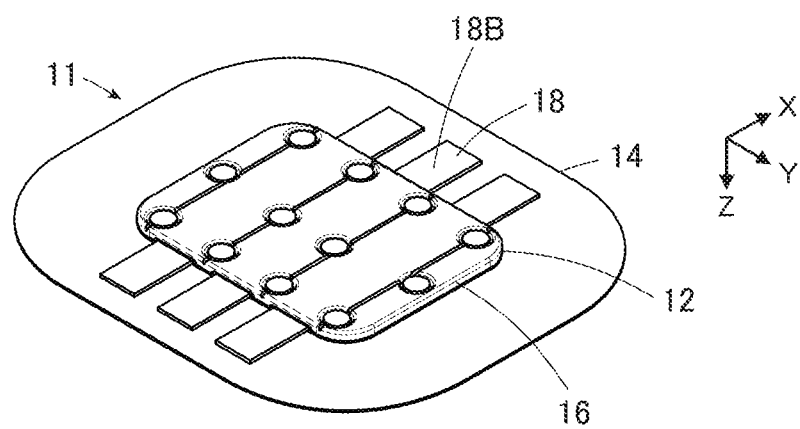
FIG. 2 is a perspective view of the connector according to Embodiment 1 when viewed from an obliquely lower position.

FIGS. 1 and 2 show a connector 11 according to Embodiment 1. The connector 11 is used as a connector for garments to be attached to a garment for fitting a wearable device. The connector 11 includes a connector body 12 made of an insulating material, and the connector body 12 holds a plurality of contacts 13 and a connector fixing member 14 of sheet shape.

The connector body 12 includes a first insulator 15 and a second insulator 16 joined to the first insulator 15. The connector fixing member 14 is held between the first insulator 15 and the second insulator 16 and extends to the outside of the connector body 12 so as to seamlessly surround the outer periphery of the connector body 12.

The first insulator 15 and the second insulator 16 each have a substantially rectangular, flat plate shape. As shown in FIG. 1, the first insulator 15 is provided with a wall portion 17 projecting so as to surround the contacts 13, and a counter connector accommodating portion 17A of recessed shape is defined by the wall portion 17. The contacts 13 project inside the counter connector accommodating portion 17A in a direction perpendicular to the bottom surface of the counter connector accommodating portion 17A. The wall portion 17 is not essential, and the first insulator 15 may have a flat plate shape.

As shown in FIG. 2, the connector 11 includes a plurality of conductive members 18 corresponding to the contacts 13 and held by the connector body 12. The conductive members 18 each include an internal conductive portion 18A (described later) that is disposed inside the connector body 12 and electrically connected to the corresponding contact 13, and an external conductive portion 18B that is disposed outside the connector body 12, extends along the connector fixing member 14 and is covered by the connector fixing member 14.

For convenience, the direction along the short sides of the substantially rectangular first and second insulators 15 and 16 is called "X direction (second direction)," the direction along the long sides thereof "Y direction (first direction)," and the direction which is perpendicular to an XY plane and in which the contacts 13 project "+Z direction."

Specifically, the six contacts 13 are arranged in two columns such that each three contacts 13 are arrayed substantially along the Y direction. Three conductive members 18 are drawn from, of the six contacts 13, the three contacts 13 arrayed in the +X direction-side column toward the +X direction side that is opposite from the side on which the −X direction-side column is situated, while the other three conductive members 18 are drawn from the three contacts 13 arrayed in the −X direction-side column toward the −X direction side that is opposite from the side on which the +X direction-side column is situated.

Thus, each three conductive members 18 are drawn from three contacts 13 arrayed in one column toward the opposite side from the side on which the other column is situated. This configuration allows the conductive members 18 to have a large width and therefore enables the conductive members 18 to have a lower electric resistance and an increased electric capacity.

Figure 3:
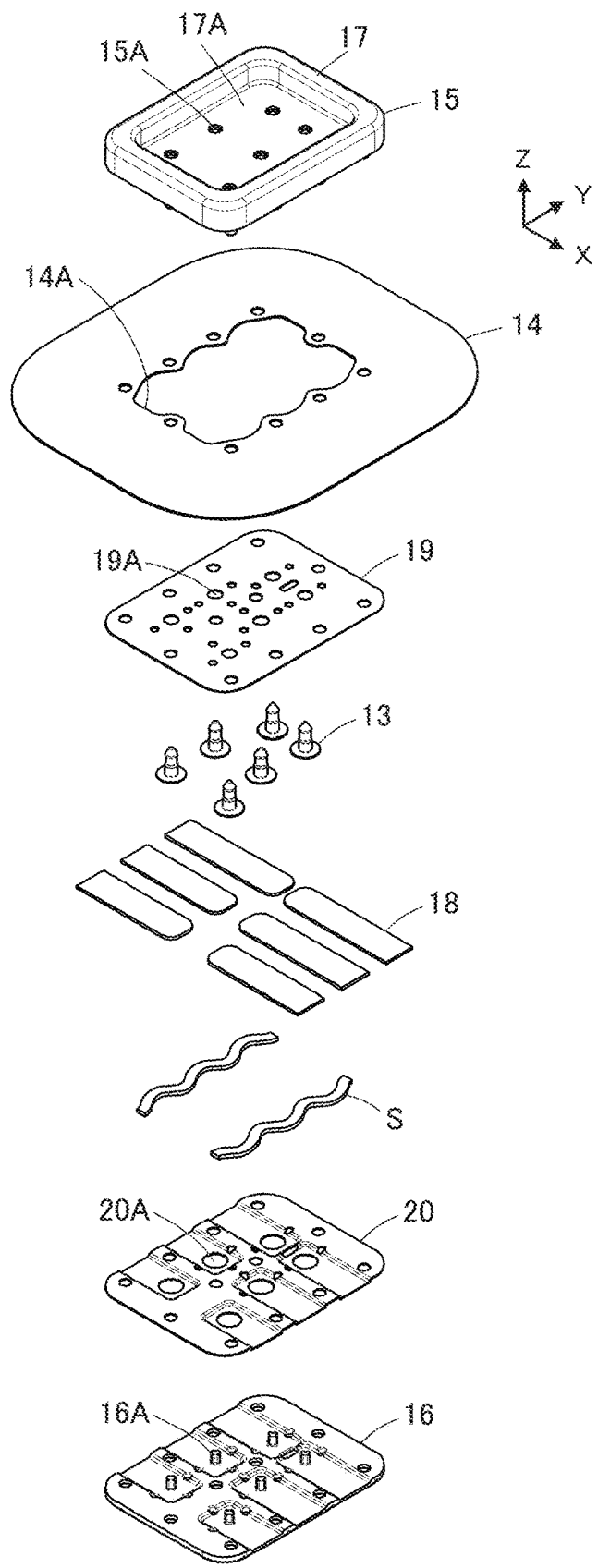
FIG. 3 is an exploded perspective view of the connector according to Embodiment 1.

As shown in FIG. 3, the connector 11 further includes a first waterproof sheet 19 disposed between the first insulator 15 and the conductive members 18, a second waterproof sheet 20 disposed between the conductive members 18 and the second insulator 16, and two penetrating adhesive sheets S disposed between the conductive members 18 and the second waterproof sheet 20.

The first insulator 15 is provided with a plurality of contact attachment holes 15A through which the contacts 13 pass.

The connector fixing member 14 of sheet shape has insulating properties and is made of resin or cloth. The connector fixing member 14 has an opening 14A in its center.

The first waterproof sheet 19 and the second waterproof sheet 20 are each formed of a sheet- or film-type solid adhesive in a rectangular shape that is almost the same as the first insulator 15 and the second insulator 16 in size. For instance, a thermoplastic adhesive of hot-melt type can be used as the first waterproof sheet 19 and the second waterproof sheet 20. The thermoplastic adhesive is a so-called hot-melt adhesive that is solid at normal temperature and when heated, is melt and establishes bonding through its cooling and solidifying process.

The first waterproof sheet 19 and the second waterproof sheet 20 are respectively provided with pluralities of through-holes 19A and 20A corresponding to the contacts 13.

The conductive members 18 are members produced by processing conductive fibers into cloth and have conductivity and flexibility.

The penetrating adhesive sheets S are formed of a solid adhesive as with the first waterproof sheet 19 and the second waterproof sheet 20, and a thermoplastic adhesive of hot-melt type can be used as the penetrating adhesive sheets S. The adhesive serving as the penetrating adhesive sheets S is, however, preferably one that has higher fluidity than the adhesive serving as the first waterproof sheet 19 and the second waterproof sheet 20 and that easily penetrates into the conductive members 18 made of conductive fibers.

The second insulator 16 is provided with a plurality of contact projections 16A corresponding to the contacts 13 and projecting in the +Z direction.

Figure 4:
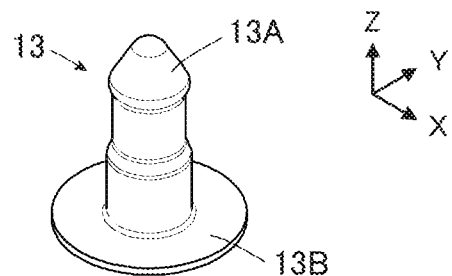
FIG. 4 is a perspective view showing a contact used in the connector of Embodiment 1.
Figure 5:
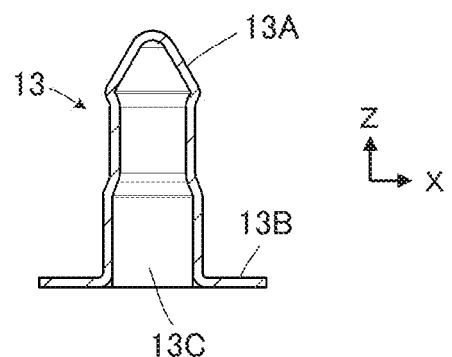
FIG. 5 is a cross-sectional view showing the contact used in the connector of Embodiment 1.

As shown in FIG. 4, the contact 13 is a plug-type contact made of a conductive material such as metal and includes a projecting portion 13A having a substantially cylindrical shape extending in the Z direction and a flange 13B extending from a base end of the projecting portion 13A on the −Z direction side along an XY plane. As shown in FIG. 5, a projection accommodating portion 13C of recessed shape is formed in the projecting portion 13A.

The contact attachment holes 15A of the first insulator 15 and the through-holes 19A of the first waterproof sheet 19 each have an inner diameter slightly larger than the outer diameter of the projecting portion 13A of the contact 13 and smaller than the outer diameter of the flange 13B.

When the connector 11 is assembled, first, the connector fixing member 14, the first waterproof sheet 19, the contacts 13, the conductive members 18, the two penetrating adhesive sheets S and the second waterproof sheet 20 are sandwiched between the first insulator 15 and the second insulator 16. At this time, the projecting portions 13A of the contacts 13 pass through the through-holes 19A of the first waterproof sheet 19, the opening 14A of the connector fixing member 14, and the contact attachment holes 15A of the first insulator 15 and project inside the counter connector accommodating portion 17A of the first insulator 15, while the conductive members 18 made of conductive fibers come into contact with the −Z direction-side surfaces of the flanges 13B of the contacts 13.

In this state, the second insulator 16 is pressed against the first insulator 15. As a result, the contact projections 16A of the second insulator 16 that project in the +Z direction are inserted into the projection accommodating portions 13C of the contacts 13 with the conductive members 18 being sandwiched therebetween, and the conductive members 18 are pushed in the +Z direction by the corresponding contact projections 16A and thereby deform, whereby the conductive members 18 come into contact with the inner peripheral surfaces of the projection accommodating portions 13C of the corresponding contacts 13.

Further, the first waterproof sheet 19 and the second waterproof sheet 20 are melted through heating treatment, and are thereafter cooled and solidified. With this, the first insulator 15 and the second insulator 16 are bonded to each other, and in addition, a waterproof layer made of the solidified adhesive is provided between the first insulator 15 and the second insulator 16 to thereby prevent water from infiltrating between the first insulator 15 and the second insulator 16.

The two penetrating adhesive sheets S disposed on the conductive members 18 are also melted through heating treatment; the penetrating adhesive sheets S exhibit high fluidity when heated, so that the melted adhesive penetrates into the conductive members 18 made of conductive fibers and is thereafter cooled and solidified. Since the adhesive forming the penetrating adhesive sheets S enters the inside of the conductive members 18 and is then solidified, water is prevented from passing inside the conductive members 18 and infiltrating between the first insulator 15 and the second insulator 16 from the outside.

The assembling operation of the connector 11 shown in FIGS. 1 and 2 is thus completed.

Figure 6:
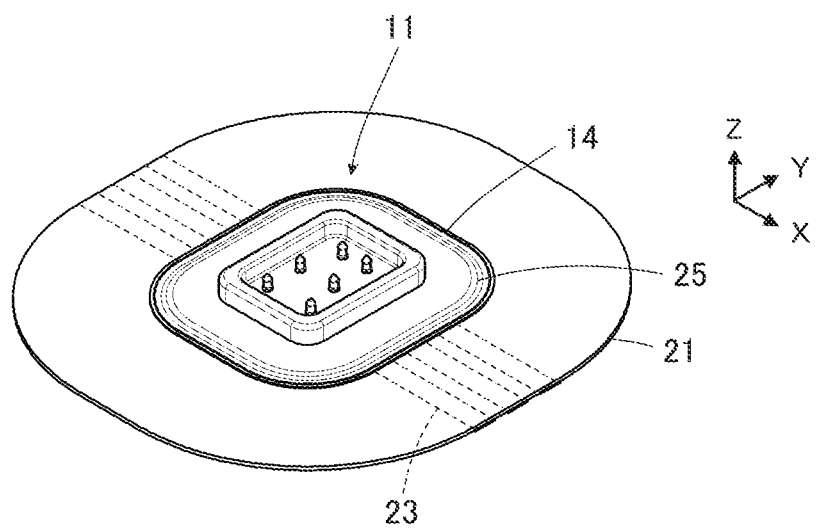
FIG. 6 is a perspective view showing the connector of Embodiment 1 attached to a garment.

As shown in FIG. 6, the connector 11 of Embodiment 1 is attached to cloth 21 of a garment. It is assumed that the backside of the cloth 21 is provided with a plurality of garment-side conductive portions 23 corresponding to the conductive members 18 of the connector 11.

After the connector 11 is placed on the cloth 21 of the garment, as the connector fixing member 14 is held up, the distal ends of the conductive members 18 of the connector 11 on the surface of the cloth 21 and the garment-side conductive portions 23 disposed on the backside of the cloth 21 are, together with the cloth 21, sewed with a conductive thread 24. Thus, the conductive members 18 of the connector 11 and the garment-side conductive portions 23 of the cloth 21 are electrically connected to each other, correspondingly.

Subsequently, the circumferential edge of the connector fixing member 14 is sewed to the cloth 21 with an insulating thread 25, whereby the connector fixing member 14 is fixed on the cloth 21. Thus, the connector 11 is attached to the garment.

Figure 7:
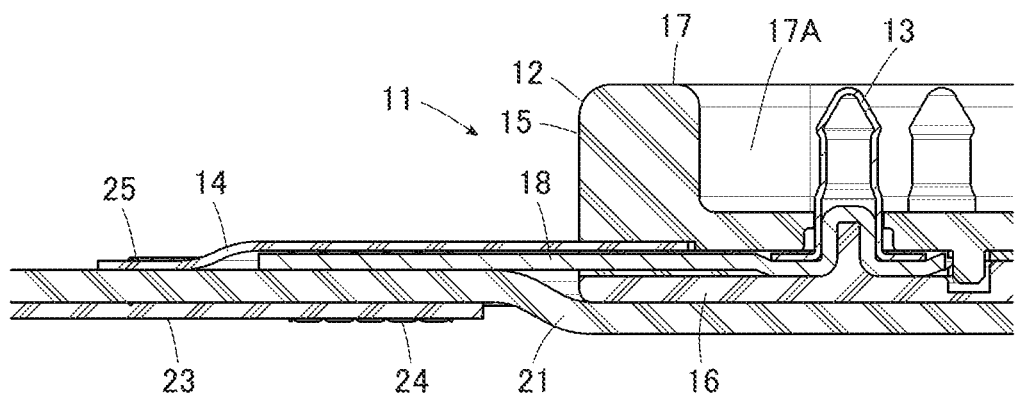
FIG. 7 is a partial cross-sectional view showing the connector of Embodiment 1 attached to the garment.

As shown in FIG. 7, the connector fixing member 14 of sheet shape and the conductive members 18 are sandwiched between the first and second insulators 15 and 16 of the connector body 12 and thereby held by the connector body 12, the conductive members 18 are sewed to the cloth 21 with the conductive thread 24 and thereby electrically connected to the garment-side conductive portions 23, and the circumferential edge of the connector fixing member 14 is sewed to the cloth 21 with the insulating thread 25 whereby the connector 11 is attached to the garment.

The wall portion 17 of the connector body 12 has a projection height not smaller than the projection height of the contacts 13 projecting inside the counter connector accommodating portion 17A.

Figure 8:
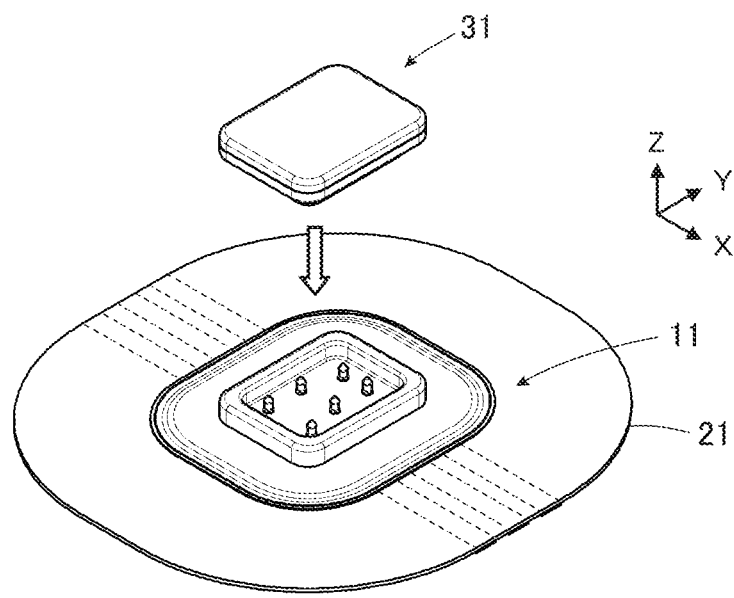
FIG. 8 is a perspective view showing the state where a counter connector is placed above and aligned with the connector of Embodiment 1.

FIG. 8 shows the state where an electronic device module 31, which is a counter connector, is aligned with the connector 11 attached to the cloth 21 of the garment.

Figure 9:
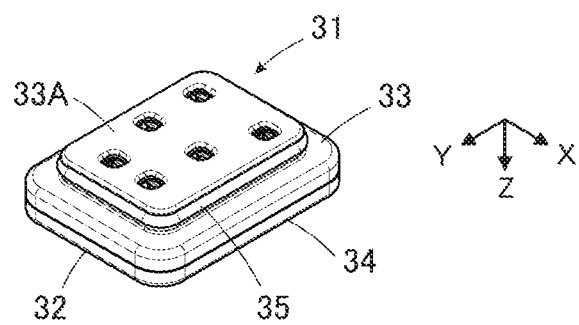
FIG. 9 is a perspective view of the counter connector when viewed from an obliquely lower position.

The electronic device module 31 includes a housing 32 made of an insulating material, as shown in FIG. 9. The housing 32 includes a first housing member 33 and a second housing member 34 joined to the first housing member 33. The first housing member 33 has a convex portion 33A projecting in the −Z direction, and a waterproof ring 35 made of an elastic material such as rubber is mounted on the outer periphery of the convex portion 33A so as to surround the convex portion 33A. The convex portion 33A is a part to be inserted into the counter connector accommodating portion 17A of recessed shape of the connector 11 when the electronic device module 31 is fitted to the connector 11.

Figure 10:
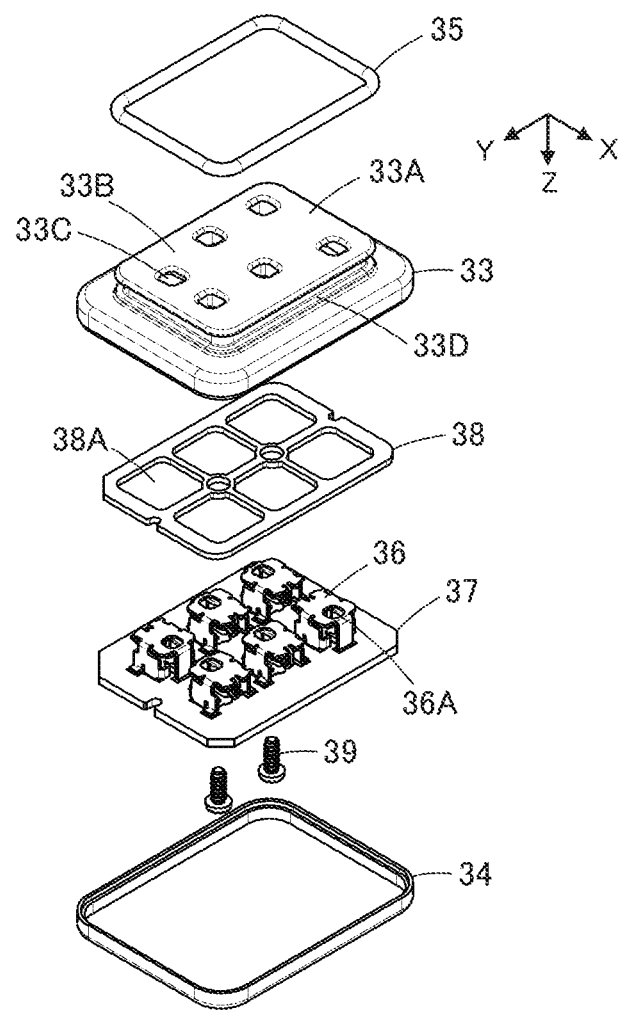
FIG. 10 is an exploded perspective view of the counter connector.

As shown in FIG. 10, the electronic device module 31 further includes a substrate 37 on which a plurality of contacts 36 are mounted, a waterproof member 38 disposed between the first housing member 33 and the substrate 37, and fastening screws 39 used for fastening the substrate 37 to the first housing member 33.

A plurality of contact accommodating holes 33C corresponding to the contacts 13 of the connector 11 are formed at a surface 33B, facing the −Z direction, of the convex portion 33A of the first housing member 33. A groove 33D for receiving the waterproof ring 35 is formed at the outer lateral surface of the convex portion 33A so as to surround the convex portion 33A.

The contacts 36 mounted on the substrate 37 are receptacle-type contacts that are connected to the plug-type contacts 13 of the connector 11 when the electronic device module 31 is fitted to the connector 11. The contacts 36 are made of a conductive material such as metal and each have an insertion hole 36A in which the corresponding contact 13 of the connector 11 is inserted.

The waterproof member 38 is provided with a plurality of openings 38A in which the contacts 36 are correspondingly inserted.

The substrate 37 having the contacts 36 mounted thereon is fastened to the first housing member 33 using the fastening screws 39 with the waterproof member 38 being sandwiched therebetween, the second housing member 34 is joined to the first housing member 33, and the waterproof ring 35 is installed in the groove 33D of the convex portion 33A of the first housing member 33. Thus, the electronic device module 31 shown in FIG. 9 is assembled.

Figure 11:
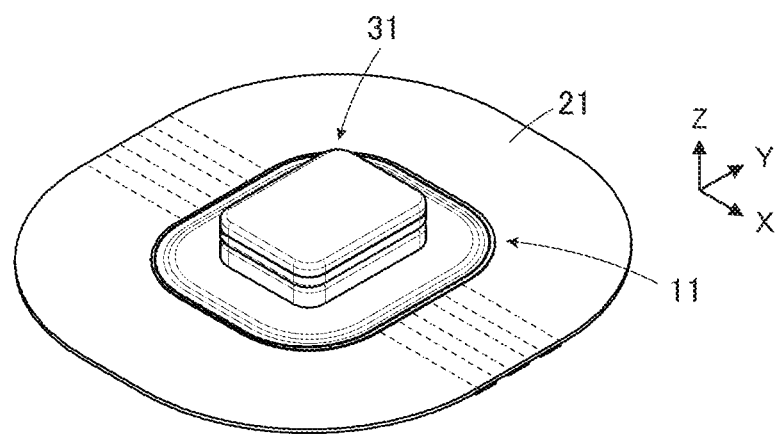
FIG. 11 is a perspective view showing the connector of Embodiment 1 fitted with the counter connector.

When the electronic device module 31 is fitted with the connector 11 as shown in FIG. 11, the convex portion 33A that is a part of the first housing member 33 of the electronic device module 31 is inserted in the counter connector accommodating portion 17A of recessed shape of the connector 11; at this time, the waterproof ring 35 of the electronic device module 31 is compressed between the outer lateral surface of the convex portion 33A of the first housing member 33 and the counter connector accommodating portion 17A of recessed shape of the connector 11 and deforms accordingly, whereby the electronic device module 31 and the connector 11 are firmly fitted with each other, while water is prevented from infiltrating between the electronic device module 31 and the connector 11.

When the convex portion 33A of the electronic device module 31 is inserted in the counter connector accommodating portion 17A of the connector 11, the plug-type contacts 13 of the connector 11 are inserted in the receptacle-type contacts 36 of the electronic device module 31 through the contact accommodating holes 33C, whereby the contacts 13 and the contacts 36 are electrically connected to each other.

Thus, the electronic device module 31 can be used as a wearable device.

Figure 12:
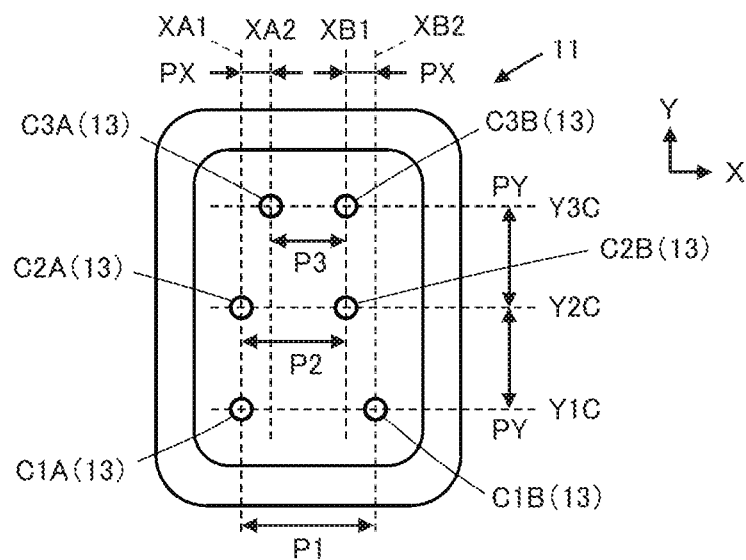
FIG. 12 is a plan view showing arrangement positions of a plurality of contacts in the connector according to Embodiment 1.

Now, the arrangement positions of the six contacts 13 of the connector 11 are shown in FIG. 12. The six contacts 13 are arranged in two columns such that each three contacts 13 are arrayed substantially along the Y direction (first direction). The three contacts 13 arrayed in the −X direction-side column are referred to as "contacts C1A, C2A and C3A," and the three contacts 13 arrayed in the +X direction-side column "contacts C1B, C2B and C3B."

The three contacts C1A, C2A and C3A arrayed in the −X direction-side column are situated on either of two contact positioning lines XA1 and XA2 that extend in the Y direction and are spaced away from each other in the X direction (second direction) by a distance PX. Specifically, the contacts C1A and C2A are situated on the contact positioning line XA1, while the contact C3A is situated on the contact positioning line XA2. Similarly, the three contacts C1B, C2B and C3B arrayed in the +X direction-side column are situated on either of two contact positioning lines XB1 and XB2 that extend in the Y direction and are spaced away from each other in the X direction by the distance PX. Specifically, the contact C1B is situated on the contact positioning line XB2, while the contacts C2B and C3B are situated on the contact positioning line XB1.

The three contacts C1A, C2A and C3A in the −X direction-side column and the three contacts C1B, C2B and C3B in the +X direction-side column are separately arrayed at a predetermined contact-to-contact pitch PY in the Y direction. The contacts C1A and C1B are situated in the same Y directional position and constitute a row Y1C extending in the X direction; in the same manner, the contacts C2A and C2B are situated in the same Y directional position and constitute a row Y2C extending in the X direction, and the contacts C3A and C3B are situated in the same Y directional position and constitute a row Y3C extending in the X direction. In other words, the six contacts C1A, C2A, C3A, C1B, C2B and C3B are arranged in two columns and three rows. To be more specific, the six contacts C1A, C2A, C3A, C1B, C2B and C3B are arranged on a lattice having, in total, four columns composed of the two contact positioning lines XA1 and XA2 on the −X direction side and the two contact positioning lines XB1 and XB2 on the +X direction side, and three rows.

With the arrangement as above, a distance P1 between the two contacts C1A and C1B in the row Y1C that is closest to the −Y directional end among the three rows Y1C, Y2C and Y3C is set to be larger than a distance P2 between the two contacts C2A and C2B in the row Y2C and a distance P3 between the two contacts C3A and C3B in the row Y3C, and also larger than the predetermined contact-to-contact pitch PY in the Y direction. In addition, the distance P3 between the two contacts C3A and C3B in the row Y3C that is closest to the +Y directional end among the three rows Y1C, Y2C and Y3C is set to be smaller than the distance P1 between the two contacts C1A and C1B in the row Y1C and the distance P2 between the two contacts C2A and C2B in the row Y2C, and also smaller than the predetermined contact-to-contact pitch PY in the Y direction.

Figure 13:
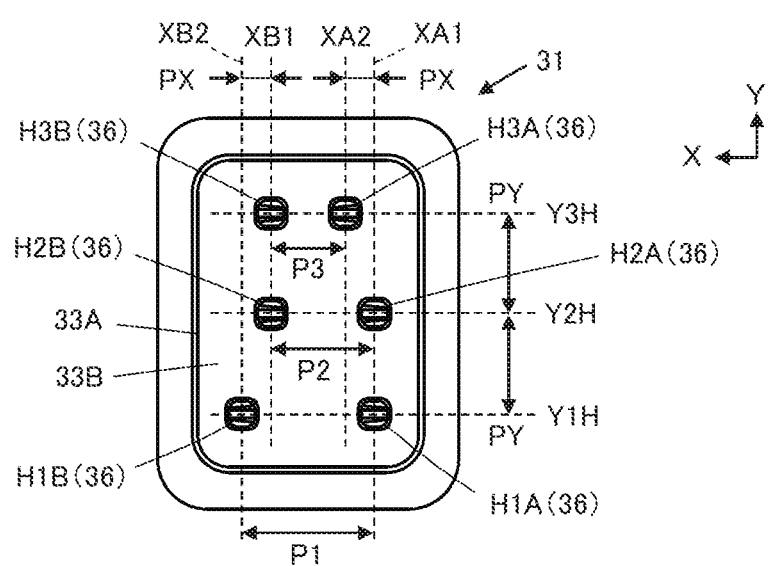
FIG. 13 is a bottom view showing arrangement positions of a plurality of contacts in the counter connector.

Next, the arrangement positions of the six contacts 36 of the electronic device module 31, which is a counter connector for the connector 11, are shown in FIG. 13. The arrangement positions of the contacts 36 herein refer to the positions where the insertion holes 36A of the contacts 36 shown in FIG. 10 are situated. As with the six contacts 13 of the connector 11, the six contacts 36 are arranged in two columns such that each three contacts 36 are arrayed substantially along the Y direction. The three contacts 36 arrayed in the −X direction-side column are referred to as "contacts H1A, H2A and H3A," and the three contacts 36 arrayed in the +X direction-side column "contacts H1B, H2B and H3B."

Note that since FIG. 13 shows the bottom view of the electronic device module 31 opposed to the connector 11, the arrangement positions of the six contacts 36 are in bisymmetric relationship with those of the six contacts 13 of the connector 11 shown in FIG. 12.

The three contacts H1A, H2A and H3A arrayed in the −X direction-side column are situated on either of the two contact positioning lines XA1 and XA2 that extend in the Y direction and are spaced away from each other in the X direction by the distance PX. Specifically, the contacts H1A and H2A are situated on the contact positioning line XA1, while the contact H3A is situated on the contact positioning line XA2. Similarly, the three contacts H1B, H2B and H3B arrayed in the +X direction-side column are situated on either of the two contact positioning lines XB1 and XB2 that extend in the Y direction and are spaced away from each other in the X direction by the distance PX. Specifically, the contact H1B is situated on the contact positioning line XB2, while the contacts H2B and H3B are situated on the contact positioning line XB1.

The three contacts H1A, H2A and H3A in the −X direction-side column and the three contacts H1B, H2B and H3B in the +X direction-side column are separately arrayed at the predetermined contact-to-contact pitch PY in the Y direction. The contacts H1A and H1B are situated in the same Y directional position and constitute a row Y1H extending in the X direction; in the same manner, the contacts H2A and H2B are situated in the same Y directional position and constitute a row Y2H extending in the X direction, and the contacts H3A and H3B are situated in the same Y directional position and constitute a row Y3H extending in the X direction. In other words, the six contacts 36 are arranged in two columns and three rows.

With the arrangement as above, the distance P1 between the two contacts H1A and H1B in the row Y1H that is closest to the −Y directional end among the three rows Y1H, Y2H and Y3H is set to be larger than the distance P2 between the two contacts H2A and H2B in the row Y2H and the distance P3 between the two contacts H3A and H3B in the row Y3H, and also larger than the predetermined contact-to-contact pitch PY in the Y direction. In addition, the distance P3 between the two contacts H3A and H3B in the row Y3H that is closest to the +Y directional end among the three rows Y1H, Y2H and Y3H is set to be smaller than the distance P1 between the two contacts H1A and H1B in the row Y1H and the distance P2 between the two contacts H2A and H2B in the row Y2H, and is also set to be smaller than the predetermined contact-to-contact pitch PY in the Y direction.

That is, the six contacts C1A, C2A, C3A, C1B, C2B and C3B of the connector 11 have the same contact-to-contact distances P1, P2 and P3 in the respective rows and the same contact-to-contact pitch PY in the Y direction as the six contacts H1A, H2A, H3A, H1B, H2B and H3B of the electronic device module 31; thus, the six contacts C1A, C2A, C3A, C1B, C2B and C3B and the six contacts H1A, H2A, H3A, H1B, H2B and H3B correspond to each other in their arrangement positions.

Figure 14:
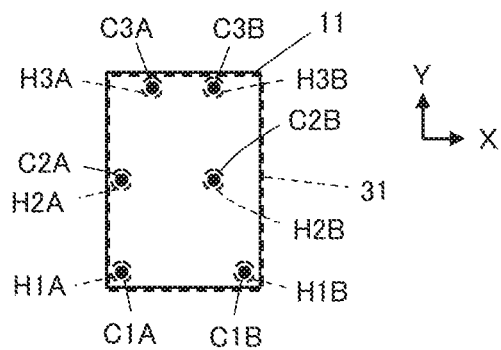
FIG. 14 is a plan view schematically showing the positional relationship between the contacts of the connector according to Embodiment 1 and the contacts of the counter connector when the counter connector is properly fitted.

Accordingly, when the electronic device module 31 is properly fitted to the connector 11, as shown in FIG. 14, the six contacts C1A, C2A, C3A, C1B, C2B and C3B of the connector 11 are correspondingly inserted in the six contacts H1A, H2A, H3A, H1B, H2B and H3B of the electronic device module 31 and electrically connected thereto.

Note that FIG. 14 shows the positional relationship of the contacts of the connector 11 and the electronic device module 31 being fitted with each other as shown in FIG. 11, in a see-through view seen from the +Z direction toward the −Z direction.

Figure 15:
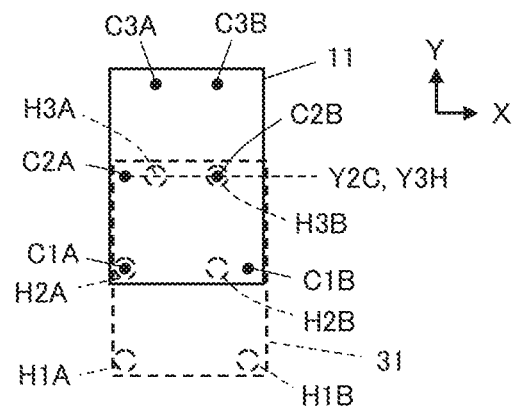
FIG. 15 is a plan view schematically showing the positional relationship between the contacts of the connector according to Embodiment 1 and the contacts of the counter connector when the counter connector is offset in a −Y direction by one contact-to-contact pitch and is thus going to be wrongly fitted.

As shown in FIG. 15, when the electronic device module 31 is placed on the connector 11 as being offset relative to the connector 11 in the −Y direction by one contact-to-contact pitch PY, the two contacts H3A and H3B in the row Y3H at the +Y directional end of the electronic device module 31 are in the same Y directional position as the two contacts C2A and C2B in the row Y2C situated in the middle of the connector 11.

Since, however, the distance P3 between the two contacts H3A and H3B in the row Y3H of the electronic device module 31 is set to be smaller than the distance P2 between the two contacts C2A and C2B in the row Y2C of the connector 11, the two contacts C2A and C2B of the connector 11 are prevented from being inserted in the two contacts H3A and H3B of the electronic device module 31. More specifically, the contact C2A of the connector 11 is in a different X directional position from that of the contact H3A of the electronic device module 31, therefore, is not inserted in the contact H3A and abuts on the surface 33B, facing the −Z direction, of the convex portion 33A of the electronic device module 31. Thus, the contacts C2A and C2B of the connector 11 are prevented from being wrongly connected to the contacts H3A and H3B of the electronic device module 31.

At this time, as shown in FIG. 15, the contacts C1A and C1B of the connector 11 are also in the same Y directional position as the contacts H2A and H2B of the electronic device module 31; however, the contact C1B of the connector 11 is not inserted in the contact H2B of the electronic device module 31 and abuts on the surface 33B of the electronic device module 31.

Figure 16:
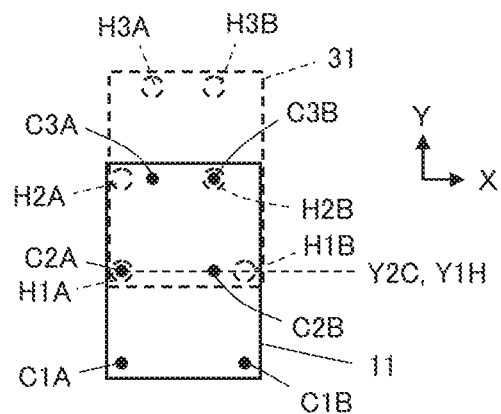
FIG. 16 is a plan view schematically showing the positional relationship between the contacts of the connector according to Embodiment 1 and the contacts of the counter connector when the counter connector is offset in a +Y direction by one contact-to-contact pitch and is thus going to be wrongly fitted.

As shown in FIG. 16, when the electronic device module 31 is placed on the connector 11 as being offset relative to the connector 11 in the +Y direction by one contact-to-contact pitch PY, the two contacts H1A and H1B in the row Y1H at the −Y directional end of the electronic device module 31 are in the same Y directional position as the two contacts C2A and C2B in the row Y2C situated in the middle of the connector 11.

Since, however, the distance P1 between the two contacts H1A and H1B in the row Y1H of the electronic device module 31 is set to be larger than the distance P2 between the two contacts C2A and C2B in the row Y2C of the connector 11, the two contacts C2A and C2B of the connector 11 are prevented from being inserted in the two contacts H1A and H1B of the electronic device module 31. More specifically, the contact C2B of the connector 11 is in a different X directional position from that of the contact H1B of the electronic device module 31, therefore, is not inserted in the contact H1B and abuts on the surface 33B of the electronic device module 31. Thus, the contacts C2A and C2B of the connector 11 are prevented from being wrongly connected to the contacts H1A and H1B of the electronic device module 31.

At this time, as shown in FIG. 16, the contacts C3A and C3B of the connector 11 are also in the same Y directional position as the contacts H2A and H2B of the electronic device module 31; however, the contact C3A of the connector 11 is not inserted in the contact H2A of the electronic device module 31 and abuts on the surface 33B of the electronic device module 31.

Accordingly, even when the electronic device module 31 is tried to be fitted to the connector 11 in a position where it is inclined in the Y direction relative to the connector 11, the electronic device module 31 is prevented from being wrongly fitted to the connector 11, and the contacts of the connector 11 are prevented from being wrongly connected to the contacts of the electronic device module 31. In other words, an incorrect fitting of the electronic device module 31 to the connector 11 and misconnection of the contacts are prevented.

Figure 17:
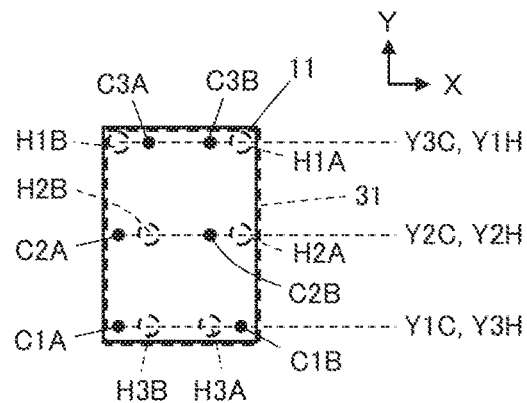
FIG. 17 is a plan view schematically showing the positional relationship between the contacts of the connector according to Embodiment 1 and the contacts of the counter connector when the counter connector is turned 180 degrees and is thus going to be wrongly fitted.

As shown in FIG. 17, when the electronic device module 31 is placed on the connector 11 in a position where it is turned 180 degrees relative to the connector 11, the two contacts H3A and H3B in the row Y3H of the electronic device module 31 are in the same Y directional position as the two contacts C1A and C1B in the row Y1C of the connector 11, similarly, the two contacts H2A and H2B in the row Y2H of the electronic device module 31 are in the same Y directional position as the two contacts C2A and C2B in the row Y2C of the connector 11, and the two contacts H1A and H1B in the row Y1H of the electronic device module 31 are in the same Y directional position as the two contacts C3A and C3B in the row Y3C of the connector 11.

However, the distance P3 between the two contacts H3A and H3B in the row Y3H of the electronic device module 31 is set to be smaller than the distance P1 between the two contacts C1A and C1B in the row Y1C of the connector 11, and the distance P1 between the two contacts H1A and H1B in the row Y1H of the electronic device module 31 is set to be smaller than the distance P3 between the two contacts C3A and C3B in the row Y3C of the connector 11. Although the distance P2 between the two contacts H2A and H2B in the row Y2H of the electronic device module 31 is the same as the distance P2 between the two contacts C2A and C2B in the row Y2C of the connector 11, since the electronic device module 31 is turned 180 degrees relative to the connector 11, the contacts H2A and H2B of the electronic device module 31 are in different X directional positions from those of the contacts C2A and C2B of the connector 11, respectively.

Thus, all of the six contacts C1A, C2A, C3A, C1B, C2B and C3B of the connector 11 are not inserted in the contacts H1A, H2A, H3A, H1B, H2B and H3B of the electronic device module 31 but abut on the surface 33B of the electronic device module 31, so that an incorrect fitting of the electronic device module 31 to the connector 11 and misconnection of the contacts are prevented.

Figure 18:
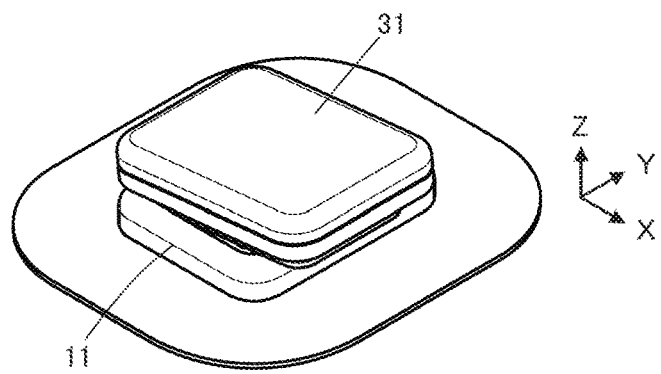
FIG. 18 is a perspective view showing the connector according to Embodiment 1 when the counter connector is turned 90 degrees and is thus going to be wrongly fitted.
Figure 19:
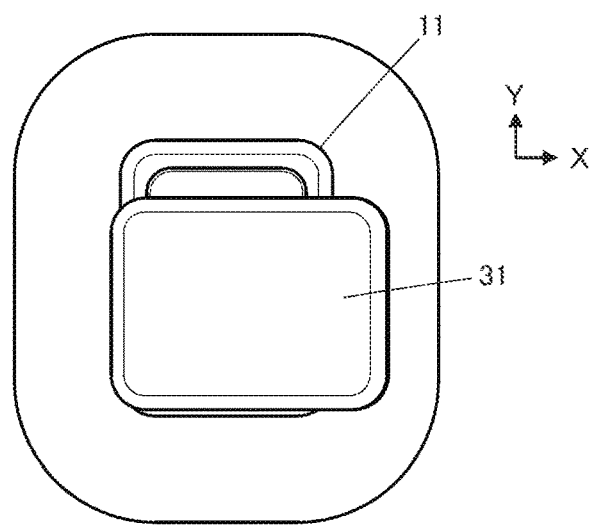
FIG. 19 is a plan view showing the connector according to Embodiment 1 when the counter connector is turned 90 degrees and is thus going to be wrongly fitted.
Figure 20:
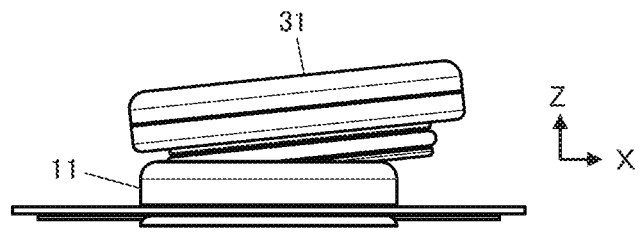
FIG. 20 is a front view showing the connector according to Embodiment 1 when the counter connector is turned 90 degrees and is thus going to be wrongly fitted.

Furthermore, the case where the electronic device module 31 is placed on the connector 11 in a position where it is turned 90 degrees relative to the connector 11 as shown in FIGS. 18 to 20 is assumed. In this case, as shown in FIG. 21, for instance, the row Y3H of the electronic device module 31 coincides with the contact positioning line XA1 of the connector 11, and thus, the contacts H3A and H3B in the row Y3H of the electronic device module 31 and the contacts C1A and C2A on the contact positioning line XA1 of the connector 11 are in the same X directional position.

Since, however, the distance P3 between the two contacts H3A and H3B in the row Y3H of the electronic device module 31 is set to be smaller than the contact-to-contact pitch PY between the two contacts C1A and C2A on the contact positioning line XA1 of the connector 11, the two contacts C1A and C2A of the connector 11 are prevented from being inserted in the two contacts H3A and H3B of the electronic device module 31. More specifically, the contact C1A of the connector 11 is in a different Y directional position from that of the contact H3A of the electronic device module 31, therefore, is not inserted in the contact H3A and abuts on the surface 33B of the electronic device module 31. Thus, the contacts C1A and C2A of the connector 11 are prevented from being wrongly connected to the contacts H3A and H3B of the electronic device module 31.

Figure 21:
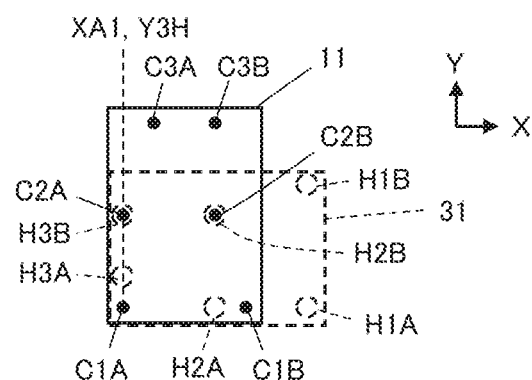
FIG. 21 is a plan view schematically showing the positional relationship between the contacts of the connector according to Embodiment 1 and the contacts of the counter connector when the counter connector is turned 90 degrees and is thus going to be wrongly fitted.

At this time, as shown in FIG. 21, the contact C1B of the connector 11 is also not inserted in the contact H2A of the electronic device module 31 and abuts on the surface 33B of the electronic device module 31.

Accordingly, even when the electronic device module 31 is tried to be fitted to the connector 11 in a position where it is turned 90 degrees relative to the connector 11, the electronic device module 31 is prevented from being wrongly fitted to the connector 11, and the contacts of the connector 11 are prevented from being wrongly connected to the contacts of the electronic device module 31. In other words, an incorrect fitting of the electronic device module 31 to the connector 11 and misconnection of the contacts are prevented.

In the same manner, even when the electronic device module 31 is tried to be fitted to the connector 11 in a position where it is turned 270 degrees relative to the connector 11, the electronic device module 31 is prevented from being wrongly fitted to the connector 11, and the contacts of the connector 11 are prevented from being wrongly connected to the contacts of the electronic device module 31.

As described above, with the use of the connector 11 according to Embodiment 1, even when the electronic device module 31 is tried to be fitted to the connector 11 in a position where it is inclined in the Y direction relative to the connector 11 or in a position where it is turned 90, 180 or 270 degrees relative to the connector 11, an incorrect fitting of the electronic device module 31 to the connector 11 and misconnection of the contacts are prevented.

Figure 26:
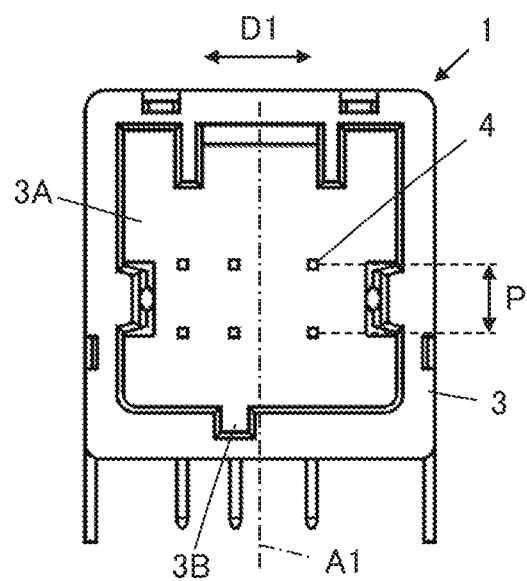
FIG. 26 is a view showing a receptacle of a conventional connector.
Figure 27:
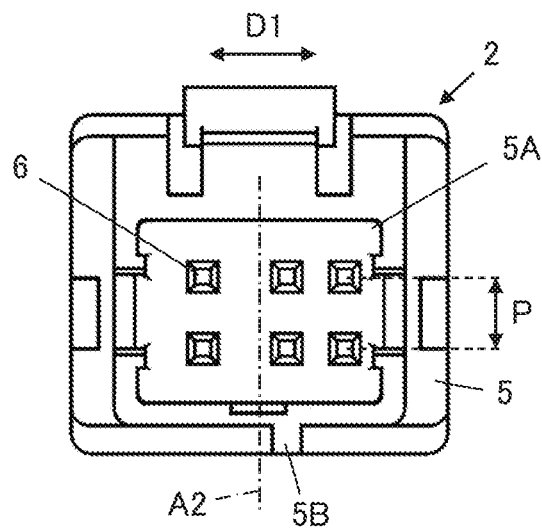
FIG. 27 is a view showing a plug of the conventional connector.

The connector 11 is configured to prevent an incorrect fitting of the electronic device module 31 and misconnection of the contacts by means of the arrangement positions of the six contacts C1A, C2A, C3A, C1B, C2B and C3B without the use of such a projection and groove for a prevention of an incorrect fitting as provided in the conventional connector shown in FIGS. 26 and 27; therefore, by mounting a ring made of an elastic material such as rubber, e.g., the waterproof ring 35 of the electronic device module 31, on the inner periphery of the wall portion 17 of the connector 11 or the outer periphery of the convex portion 33A of the electronic device module 31, water can be easily and effectively prevented from infiltrating between the connector 11 and the electronic device module 31.

Even if the wall portion 17 is not provided, the connector 11 according to Embodiment 1 still can prevent an incorrect fitting of the electronic device module 31 and misconnection of the contacts by means of the arrangement positions of the six contacts C1A, C2A, C3A, C1B, C2B and C3B; however, by adopting the configuration in which the convex portion 33A of the electronic device module 31 is inserted in the counter connector accommodating portion 17A of recessed shape defined by the wall portion 17 of the connector 11, an incorrect fitting and misconnection can be more reliably prevented.

It is favorable that the wall portion 17 of the connector 11 has a projection height not smaller than the projection height of the contacts C1A, C2A, C3A, C1B, C2B and C3B projecting inside the counter connector accommodating portion 17A for the purpose of preventing misconnection of the contacts.

Figure 22:
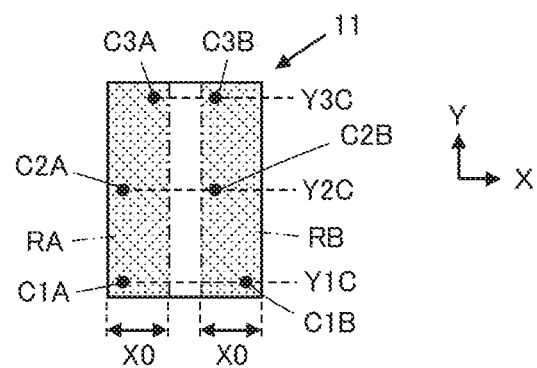
FIG. 22 is a plan view schematically showing arrangement positions of a plurality of contacts in a connector of a modification of Embodiment 1.

In the connector 11 according to Embodiment 1, the three contacts C1A, C2A and C3A arrayed in the −X direction-side column are situated on either of the two contact positioning lines XA1 and XA2, and the three contacts C1B, C2B and C3B arrayed in the +X direction-side column are situated on either of the two contact positioning lines XB1 and XB2; however, the invention is not limited thereto. As schematically shown in FIG. 22, the three contacts C1A, C2A and C3A on the −X direction side are arranged so as to be included within a column area RA that extends in the Y direction and has a predetermined width X0 in the X direction, while the three contacts C1B, C2B and C3B on the +X direction side are arranged so as to be included within a column area RB that extends in the Y direction and has the predetermined width X0 in the X direction.

In other words, even when each of the contacts C1A, C2A and C3A has an X directional position that is within the column area RA and is not necessarily on either of the contact positioning lines XA1 and XA2 and when each of the contacts C1B, C2B and C3B has an X directional position that is within the column area RB and is not necessarily on either of the contact positioning lines XB1 and XB2, if the distance between two contacts in, of the three rows Y1C, Y2C and Y3C, one row situated at one end in the Y direction is larger than the distance between two contacts in each of the other two rows and also different in length from the predetermined contact-to-contact pitch PY in the Y direction and if the distance between two contacts in a row situated at the other end in the Y direction is smaller than the distance between two contacts in each of the other two rows and also different in length from the predetermined contact-to-contact pitch PY in the Y direction, an incorrect fitting of the electronic device module 31 and misconnection of the contacts can be prevented.

Figure 23:
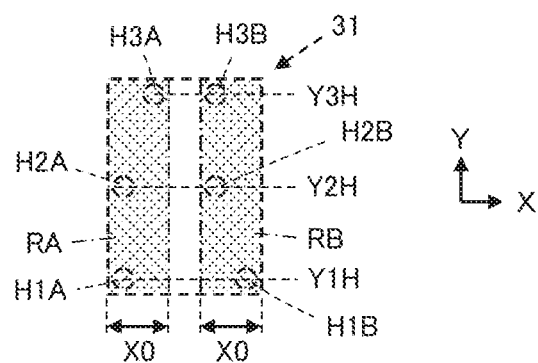
FIG. 23 is a plan view schematically showing arrangement positions of a plurality of contacts in a counter connector corresponding to the connector of the modification of Embodiment 1.

In this case, also in the electronic device module 31 that is a counter connector for the connector 11, as schematically shown in FIG. 23, the three contacts H1A, H2A and H3A on the −X direction side are arranged so as to be included within the column area RA that extends in the Y direction and has the predetermined width X0 in the X direction, while the three contacts H1B, H2B and H3B on the +X direction side are arranged so as to be included within the column area RB that extends in the Y direction and has the predetermined width X0 in the X direction.

It can be said that the connector 11 of Embodiment 1 has the configuration in which the contacts C1A, C2A and C3A are arranged on either of the two contact positioning lines XA1 and XA2 defined within the column area RA and the contacts C1B, C2B and C3B are arranged on either of the two contact positioning lines XB1 and XB2 defined within the column area RB.

Figure 24:
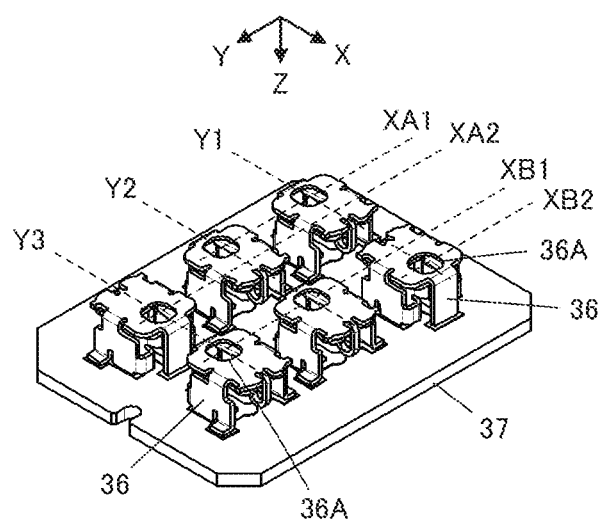
FIG. 24 is a perspective view showing the contacts of the counter connector.

In the meantime, as shown in FIG. 10, the contacts 36 of the electronic device module 31 used in Embodiment 1 are configured such that the insertion holes 36A are formed in offset positions. Therefore, as shown in FIG. 24, only by reversing the orientation of a desired contact 36 in the X direction, the insertion hole 36A of that contact 36 can be selectively situated on either of the two contact positioning lines XA1 and XA2 or either of the two contact positioning lines XB1 and XB2, and the arrangement positions of the six contacts 36 with respect to the substrate 37 need not be changed. Thus, the contacts 36 of the electronic device module 31 are suitable for the configuration in which contacts in each of two columns are individually situated on either of two contact positioning lines.

While the conductive member 18 used in the connector 11 of Embodiment 1 is made of conductive fibers, a component formed by coating resin or cloth with a conductive film may also be used, for example.

When the contact 13 is electrically connected to the conductive member 18 by soldering or the like, the conductive member 18 need not be flexible. Accordingly, the conductive member 18 may also be made of a metal sheet or the like.

In the connector 11 of Embodiment 1, the circumferential edge of the connector fixing member 14 held by the connector body 12 is sewed to the cloth 21 whereby the connector 11 is attached to the garment; however, the invention is not limited thereto, and for instance, the connector 11 may be attached to the garment by sandwiching the cloth 21 of the garment between the first insulator 15 and the second insulator 16. In this case, the connector fixing member 14 is not necessary.

While, in Embodiment 1, the connector 11 has the plug-type contacts 13 and the electronic device module 31 has the receptacle-type contacts 36, the connector 11 may have the receptacle-type contacts 36 and the electronic device module 31 may have the plug-type contacts 13 in the opposite manner.

Embodiment 2

While, in Embodiment 1 above, the connector 11 includes the six contacts arranged in two columns and three rows, the invention is not limited thereto, and the connector 11 may have the contacts 13 arranged in two columns and four or more rows. In other words, the connector 11 may have two-by-N (i.e., 2×N) contacts 13 arranged in N rows, where N is an integer of three or more. In accordance with the number of the contacts 13, two-by-N conductive members 18 are necessary.

Figure 25:
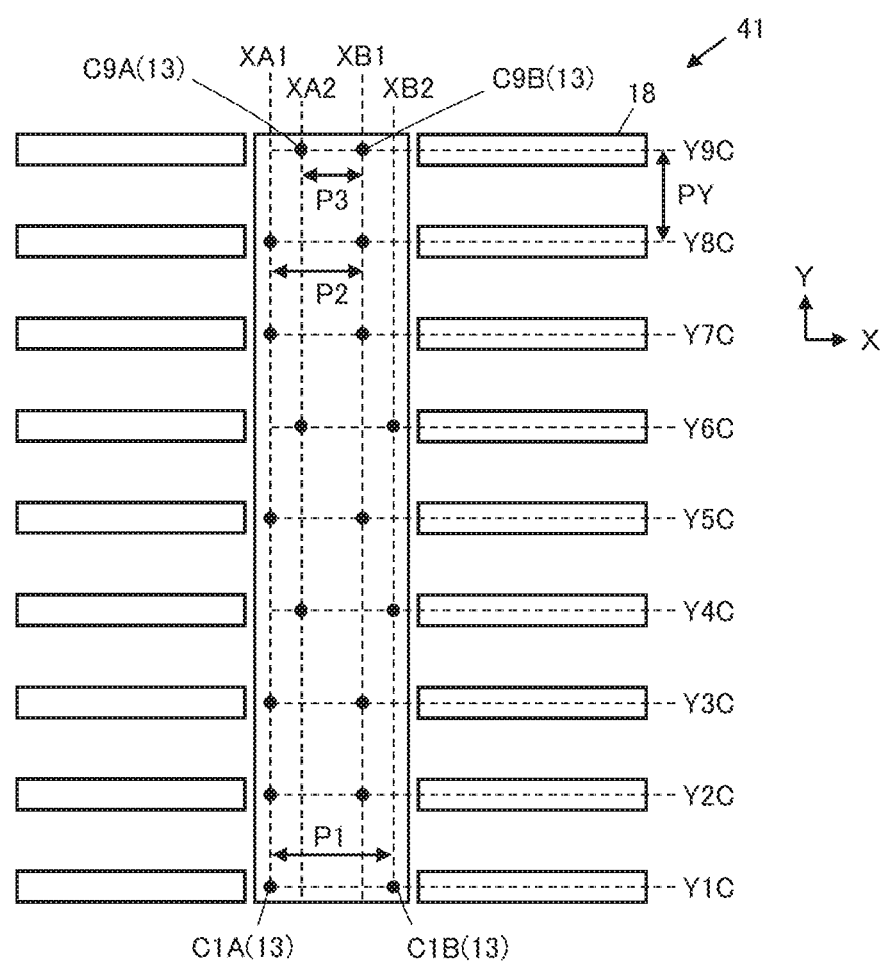
FIG. 25 is a plan view schematically showing the arrangement of a plurality of contacts in a connector according to Embodiment 2.

Assuming that N=9, FIG. 25 schematically shows the arrangement positions of the contacts 13 arranged in two columns and nine rows, i.e., eighteen contacts 13 in total in a connector 41. The eighteen contacts 13 are arranged in two columns such that each nine contacts 13 are arrayed substantially along the Y direction. Nine conductive members 18 corresponding to the nine contacts 13 arrayed on the −X direction side are arranged to extend in the −X direction, while the other nine conductive members 18 corresponding to the nine contacts 13 arrayed on the +X direction side are arranged to extend in the +X direction. The nine contacts 13 arrayed in the −X direction-side column are referred to as "contacts C1A to C9A," and the nine contacts 13 arrayed in the +X direction-side column "contacts C1B to C9B."

The nine contacts C1A to C9A arrayed in the −X direction-side column are situated on either of the two contact positioning lines XA1 and XA2 extending in the Y direction, and the nine contacts C1B to C9B arrayed in the +X direction-side column are situated on either of the two contact positioning lines XB1 and XB2 extending in the Y direction.

The nine contacts C1A to C9A in the −X direction-side column and the nine contacts C1B to C9B in the +X direction-side column are separately arrayed at the predetermined contact-to-contact pitch PY in the Y direction. Each of nine rows Y1C to Y9C is constituted of two contacts situated in the same Y directional position.

The distance P1 between the two contacts C1A and C1B in the row Y1C that is closest to the −Y directional end among the nine rows Y1C to Y9C is set to be larger than the distance between two contacts in each of the other rows Y2C to Y9C and also larger than the predetermined contact-to-contact pitch PY in the Y direction. The distance P3 between the two contacts C9A and C9B in the row Y9C that is closest to the +Y directional end among the nine rows Y1C to Y9C is set to be smaller than the distance between two contacts in each of the other rows Y1C to Y8C and also smaller than the predetermined contact-to-contact pitch PY in the Y direction. The two contacts in each of the rows Y2C to Y8C are spaced away from each other in the X direction by a distance P2.

Although not illustrated, a counter connector of the connector 41 also includes 18 contacts arranged in the same manner as the 18 contacts 13 of the connector 41.

The distance P1 between the two contacts C1A and C1B in the row Y1C at the −Y directional end is set to be larger than the distance between two contacts in each of the other rows Y2C to Y9C, and the distance P3 between the two contacts C9A and C9B in the row Y9C at the +Y directional end is set to be smaller than the distance between two contacts in each of the other rows Y1C to Y8C. Accordingly, even when the counter connector is tried to be fitted to the connector 41 in a position where it is inclined in the Y direction relative to the connector 41, in a position offset from the connector 41 in the Y direction, or in a position where it is turned 180 degrees relative to the connector 41, the counter connector is prevented from being wrongly fitted to the connector 41, and the contacts of the connector 41 are prevented from being wrongly connected to the contacts of the counter connector. In other words, an incorrect fitting of the counter connector to the connector 41 and misconnection of the contacts are prevented.

Since the distance P1 between the two contacts C1A and C1B in the row Y1C at the −Y directional end and the distance P3 between the two contacts C9A and C9B in the row Y9C at the +Y directional end are each different in length from the predetermined contact-to-contact pitch PY in the Y direction, even when the counter connector is tried to be fitted to the connector 41 in a position where it is turned 90 or 270 degrees relative to the connector 41, the counter connector is prevented from being wrongly fitted to the connector 41, and the contacts of the connector 41 are prevented from being wrongly connected to the contacts of the counter connector.

In the same manner, an incorrect fitting of a counter connector and misconnection of contacts can be prevented also with a connector having the contacts 13 arranged in two columns and any of four to eight and ten or more rows.

What is claimed is:

1. A connector comprising:
   two by N contacts arranged in two columns and N rows, where N is an integer of three or more,
   wherein N contacts in each column are arrayed at a predetermined contact-to-contact pitch in a first direction parallel to each column within a corresponding one of column areas each extending in the first direction and having a predetermined width in a second direction perpendicular to the first direction,
   wherein a distance between two contacts in one endmost row in the first direction among the N rows is larger than a distance between two contacts in each of the other rows and is different in length from the predetermined contact-to-contact pitch, and
   wherein a distance between two contacts in the other endmost row in the first direction among the N rows is smaller than a distance between two contacts in each of the other rows and is different in length from the predetermined contact-to-contact pitch.

2. The connector according to claim 1,
   wherein the distance between the two contacts in the one endmost row in the first direction among the N rows is larger than the predetermined contact-to-contact pitch, and
   wherein the distance between the two contacts in the other endmost row in the first direction among the N rows is smaller than the predetermined contact-to-contact pitch.

3. The connector according to claim 1,
   wherein N conductive members are drawn to extend along the second direction from the N contacts in each column toward a side opposite from a side on which the other column is situated.

4. The connector according to claim 1,
   wherein the connector is a connector for garments to be attached to a garment.

5. The connector according to claim 1,
   wherein each contact is situated on either of two contact positioning lines that are defined within a corresponding one of the column areas, extend in the first direction, and are spaced away from each other in the second direction.

6. The connector according to claim 5,
   wherein the two by N contacts are arranged on a lattice having four columns and the N rows, the four columns being composed of the two contact positioning lines in one of the column areas and the two contact positioning lines in the other of the column areas.

7. The connector according to claim 1, including a connector body that is made of an insulating material and holds the two by N contacts,
   wherein the connector body includes: a wall portion projecting so as to surround the two by N contacts; and a counter connector accommodating portion of a recessed shape formed by the wall portion into which a part of a housing of a counter connector is inserted when the connector is fitted with the counter connector.

8. The connector according to claim 7,
   wherein each of the two by N contacts comprises a plug-type contact projecting within the counter connector accommodating portion, and
   wherein the wall portion has a projection height not smaller than a projection height of the plug-type contact.

* * * * *